United States Patent
Manolakos et al.

(10) Patent No.: US 10,305,633 B2
(45) Date of Patent: May 28, 2019

(54) PER-SYMBOL K-BIT INTERLEAVER

(71) Applicant: QUALCOMM Incorporated, San Diego, CA (US)

(72) Inventors: Alexandros Manolakos, San Diego, CA (US); Hari Sankar, San Diego, CA (US); Peter Ang, San Diego, CA (US); Krishna Mukkavilli, San Diego, CA (US); Joseph Binamira Soriaga, San Diego, CA (US); Tingfang Ji, San Diego, CA (US); Alexei Gorokhov, San Diego, CA (US); Peter Gaal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 15/487,041

(22) Filed: Apr. 13, 2017

(65) Prior Publication Data

US 2018/0083736 A1    Mar. 22, 2018

Related U.S. Application Data

(60) Provisional application No. 62/396,640, filed on Sep. 19, 2016.

(51) Int. Cl.
*H04L 1/00* (2006.01)
*H04L 5/00* (2006.01)
(Continued)

(52) U.S. Cl.
CPC .......... *H04L 1/0071* (2013.01); *H03M 13/27* (2013.01); *H04L 5/0007* (2013.01); *H04B 1/02* (2013.01); *H04L 1/0057* (2013.01); *H04L 1/0067* (2013.01)

(58) Field of Classification Search
CPC ..................................................... H04L 1/0057
(Continued)

(56) References Cited

U.S. PATENT DOCUMENTS

2009/0245426 A1* 10/2009 Ratnakar ............... H04L 1/0045
  375/327
2010/0040163 A1*  2/2010 Caire ................... H04L 1/0003
  375/261

(Continued)

FOREIGN PATENT DOCUMENTS

| CA | 2931501 A1 | 6/2015 |
| EP | 1352478 A2 | 10/2003 |
| EP | 1813025 A2 | 8/2007 |

OTHER PUBLICATIONS

International Search Report and Written Opinion—PCT/US2017/047767—ISA/EPO—dated Nov. 20, 2017. (14 total pages).

(Continued)

*Primary Examiner* — Fritz Alphonse
(74) *Attorney, Agent, or Firm* — Arent Fox LLP

(57) ABSTRACT

The present disclosure provides techniques for performing bit-level interleaving for orthogonal frequency-divisional multiplexing (OFDM) symbols across a plurality of code blocks. In some aspects, a transmitting device may dynamically switch between bit-level interleaving and tone-level interleaving for each OFDM symbol based on factors such as number of bits that are carried in each tone, size of each code block, the processing time requirements of the transmitting device and/or the receiving device, or the transmitting device preference.

30 Claims, 8 Drawing Sheets

(51) Int. Cl.
*H03M 13/27* (2006.01)
*H04B 1/02* (2006.01)

(58) Field of Classification Search
USPC ......................................................... 714/776
See application file for complete search history.

(56) References Cited

U.S. PATENT DOCUMENTS

| | | | |
|---|---|---|---|
| 2011/0013615 A1* | 1/2011 | Lee ...................... | H04L 5/0023 370/344 |
| 2011/0033001 A1 | 2/2011 | Roh et al. | |
| 2012/0121032 A1* | 5/2012 | Sandhu ................ | H04L 1/0071 375/267 |

OTHER PUBLICATIONS

Zheng J., et al., "LDPC for 11AC", 11-10-1300-00-00ac-ldpc-for-11ac, IEEE Standards, Piscataway, NJ, USA, vol. 802.11ac, Nov. 8, 2010, pp. 1-39, XP002694969, [retrieved on Nov. 8, 2010].

\* cited by examiner

380

Read 360

| 325-a | 330-a | 335-a |
|-------|-------|-------|
| 325-b | 330-b | 335-b |

Write

355

PER-SYMBOL K-BIT INTERLEAVER

CROSS-REFERENCE TO RELATED APPLICATION(S)

This application claims benefit of U.S. Provisional Application Ser. No. 62/396,640, entitled "PER-SYMBOL K-BIT INTERLEAVER" and filed Sep. 19, 2016, which is expressly incorporated by reference herein in its entirety.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, and single-carrier frequency division multiple access (SC-FDMA) systems These multiple access technologies have been adopted in various telecommunication standards to provide a common protocol that enables different wireless devices to communicate on a municipal, national, regional, and even global level. For example, 5G new radio (NR) communications technology is envisaged to expand and support diverse usage scenarios and applications with respect to current mobile network generations. In an aspect, 5G communications technology includes enhanced mobile broadband addressing human-centric use cases for access to multimedia content, services and data; ultra-reliable-low latency communications (URLLC) with strict requirements, especially in terms of latency and reliability; and massive machine type communications for a very large number of connected devices and typically transmitting a relatively low volume of non-delay-sensitive information. As the demand for mobile broadband access continues to increase, however, there exists a need for further improvements in 5G communications technology and beyond.

SUMMARY

Aspects of the present disclosure provide techniques for performing bit-level interleaving for each orthogonal frequency-divisional multiplexing (OFDM) symbol across a plurality of code blocks. In some aspects, a transmitting device may dynamically switch between bit-level interleaving and tone-level interleaving for each OFDM symbol based on factors such as number of bits that are carried in each tone, a multiple input, multiple output (MIMO) transmission rank, modulation and coding scheme index, transmission scheme (e.g., whether open-loop, close-loop, or semi-open loop), size of each code block, the processing time requirements of the transmitting device and/or the receiving device, or the transmitting device preference. Additionally or alternatively, with respect to the transmission scheme, the interleaver may determine whether the transmission scheme is a transparent or non-transparent transmission scheme. For example, for a non-transparent transmission scheme such as space-frequency block-coded (SFBC), a bit-interleaver may be better suited than an tone interleaver due to implementation complexity. It should also be appreciated that the transmitting device is not limited to switching between bit-level interleaving and tone-level interleaving in isolation. Instead, the transmitting device may also switch between employing an interleaving technique identified above and, in some situations, employing no interleaving technique for the transmission. It should be appreciated by those of ordinary skill that, in some situations, while no interleaving is employed by the transmitting device for the inter-code block interleaving, the transmitting device nonetheless may include some intra-code block interleaving (e.g., inside each code block). Interleaving may be a technique employed to reduce the impact of burst errors on a signal by either, in case of "bit-level interleaving," reordering the sequence of the data bits in a bit stream across a plurality of code blocks prior to mapping the complex-valued modulation symbols for each antenna port to corresponding resource elements of a bandwidth, or, in case of "tone-level interleaving," reordering the data resource elements (e.g., resource elements that are allocated to data bits) associated with the one or more code blocks after the resource element mapping process. For purposes of this disclosure, the terms "tone" and "resource element" may be used interchangeably. Additionally or alternatively, in some examples, the bit-level interleaving and tone-level interleaving may correspond to substantially the same effective procedure. This may be because, in some instances, the level of interleaving performed by bit-level interleaving may reconfigure sufficient number of bits in one tone such that both bit-level interleaving and tone-level interleaving may provide the same effective result.

In accordance with various aspects of the present disclosure, a method for transmitting subframes in wireless communications is disclosed. The method may include generating, at a transmitting device, encoded bits for a plurality of code blocks, and interleaving the encoded bits across the plurality of code blocks to generate interleaved encoded bits. In some examples, the method may further include mapping the interleaved encoded bits to a plurality of resource elements in an OFDM symbol, and transmitting the mapped resource elements to a receiving device.

In further examples, a transmitting device (e.g., apparatus) for transmitting subframes in wireless communications is disclosed. The apparatus may include a processor and a memory coupled to the processor. The memory may include instructions executable by the processor to generate, at the transmitting device, encoded bits for a plurality of code blocks, and to interleave the encoded bits across the plurality of code blocks to generate interleaved encoded bits. In some examples, the instructions may further be executable to map the interleaved encoded bits to a plurality of resource elements in an OFDM symbol, and transmit the mapped resource elements to a receiving device.

In another example, a computer readable medium for transmitting subframes in wireless communications is disclosed. The computer readable medium may include code for transmitting subframes in wireless communications is disclosed. The computer readable medium may further include code for generating, at a transmitting device, encoded bits for a plurality of code blocks, and code for interleaving the encoded bits across the plurality of code blocks to generate interleaved encoded bits. In some examples, the computer readable medium may further include code for mapping the interleaved encoded bits to a plurality of resource elements in an OFDM symbol, and code for transmitting the mapped resource elements to a receiving device.

In another example, an apparatus for transmitting subframes in wireless communications is disclosed. The apparatus may include means for generating, at a transmitting device, encoded bits for a plurality of code blocks, and means for interleaving the encoded bits across the plurality of code blocks to generate interleaved encoded bits. In some examples, the apparatus may further include means for mapping the interleaved encoded bits to a plurality of resource elements in an OFDM symbol, and means for transmitting the mapped resource elements to a receiving device.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
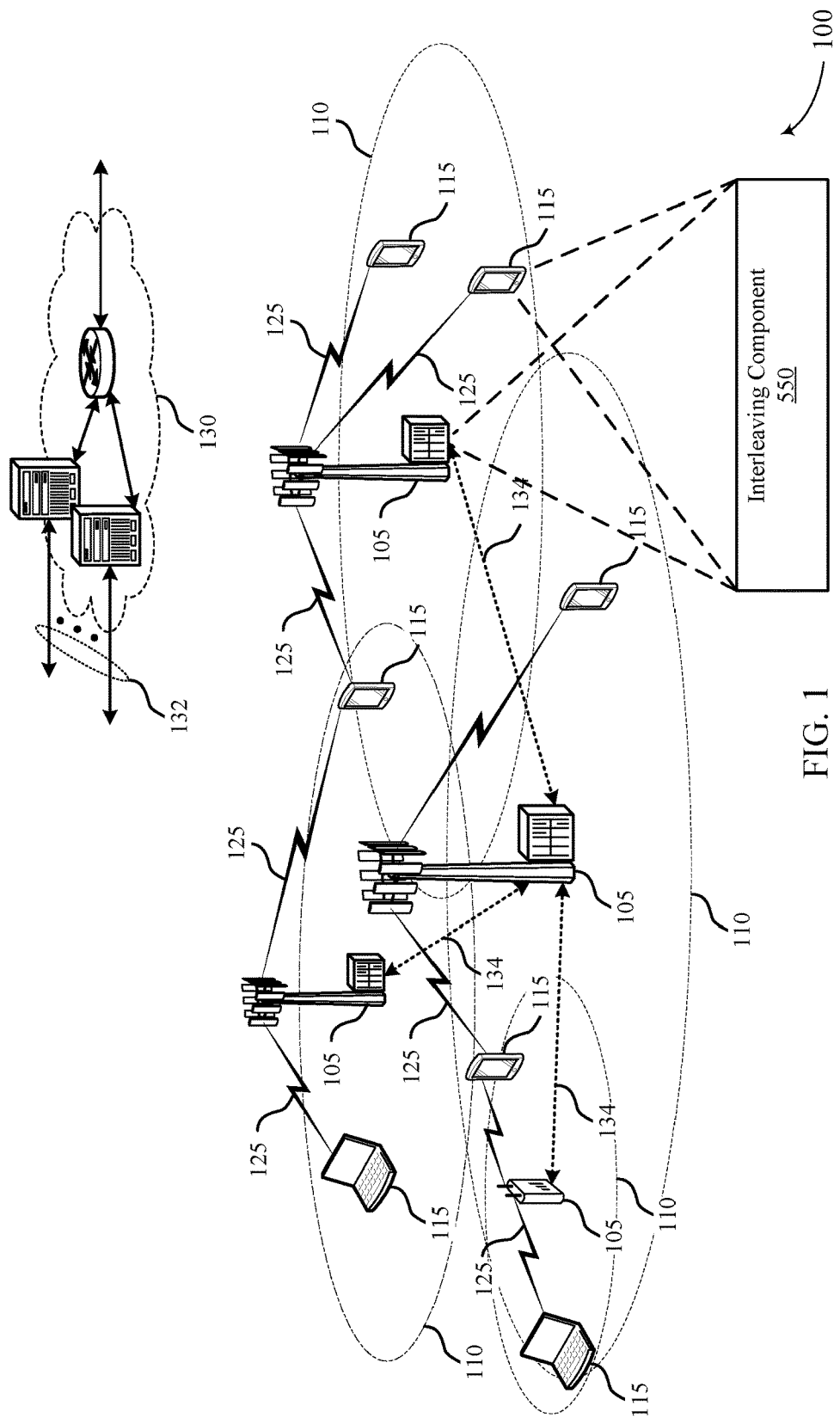
FIG. 1 illustrates an example of a wireless communications system that supports transport block segmentation and signaling in accordance with aspects of the present disclosure.

In some deployments, UEs and base stations may rely on transmissions of data in transport blocks in order to successfully receive and decode transmitted data. In some cases, transport blocks may include a number of code blocks that are transmitted by a UE or a base station. Code blocks sizes within a transport block are determined by a number of factors, such as a size of the transport block, coding rate, modulation order, or interleaver characteristics, among others. In some examples, the code blocks may be mapped to symbols in one or more resource blocks (RBs) and an interleaving process (e.g., via a bit-interleaver or tone-interleaver) may be performed prior to transmission of the code blocks. In some examples, the bit-level interleaving process may be performed prior to the code blocks being mapped to symbols, while the tone-level interleaving process may be performed after the code blocks are mapped to symbols for transmission.

Aspects of the present disclosure are directed to adjusting the granularity of the interleaving processes, by the transmitting device (e.g., UE or base station), on a per OFDM symbol basis. That is, for each OFDM symbol, interleaving adjustment or adaptation may be enabled and/or performed. For the purposes of reducing the impact of burst errors on a signal and minimizing inter-cell interference, bit-level interleaving (or simply bit interleaving) may provide improved diversity (e.g., spreading data across plurality of code blocks via bit-level interleaving over tone-level interleaving that spreads data in frequency domain across the available bandwidth) at the cost of resources expended in terms of processor time, power consumption, etc. Conversely, while tone-level interleaving (or simply tone interleaving) may be less resource intensive, the benefits obtained via tone-level interleaving may not be as impactful as those observed via bit-level interleaving.

As such, the transmitting device, in some examples, considers factors such as number of bits that are carried in each tone, size of each code block, the processing time requirements of the transmitting device and/or the transmitting device, or the transmitting device preference whether to select bit-level interleaving or tone-level interleaving for each OFDM symbol. For example, if each tone (or "resource element") carries only a few data bits, then there may be very small performance loss in using tone-level interleaving process than bit-level interleaving process. Similarly, if the size of the code block is considerably large (e.g., above a threshold), then a bit-level interleaving process may not demonstrate an improved performance over the tone-interleaving process because there may not be a large number of code blocks in a codeword for the data bits to be interleaved across. The term "codeword" may refer to an encoded bit sequence that may be segmented into a plurality of "code blocks" comprising subset of bits. In some examples, a minimum and/or maximum code block size may be specified so that the block sizes are compatible with the block sizes supported by either the interleavers (e.g., bit-interleaver or tone-interleaver). Further, if a faster acknowledgment (ACK) turn-around time is required by the transmitting device, then the transmitting device may switch to a tone-level interleaver in order to realize the improved processing advantage over the bit-level interleaver for the particular OFDM symbol. In other examples, a transmitting device may signal the transmitting device preference to the receiving device for the selected interleaver (e.g., bit-interleaver or tone-interleaver) so that receiving device may appropriately decode the received signal.

Various aspects are now described in more detail with reference to the FIGS. 1-6. In the following description, for purposes of explanation, numerous specific details are set forth in order to provide a thorough understanding of one or more aspects. It may be evident, however, that such aspect(s) may be practiced without these specific details. Additionally, the term "component" as used herein may be one of the parts that make up a system, may be hardware, firmware, and/or software stored on a computer-readable medium, and may be divided into other components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Referring to FIG. 1, in accordance with various aspects of the present disclosure, an example wireless communication network 100 may include one or more base stations 105, one or more UEs 115, and a core network 130. The core network 130 may provide user authentication, access authorization, tracking, internet protocol (IP) connectivity, and other access, routing, or mobility functions. The base stations 105 may interface with the core network 130 through backhaul links 134 (e.g., S1, etc.). The base stations 105 may perform radio configuration and scheduling for communication with the UEs 115, or may operate under the control of a base station controller (not shown). In various examples, the base stations 105 may communicate, either directly or indirectly (e.g., through core network 130), with one another over backhaul links 134 (e.g., X1, etc.), which may be wired or wireless communication links. In some examples, one or more UEs 115 may include an interleaving component 550 to perform one or more techniques of the present disclosure. Components and sub-components of the interleaving component 550 are described in detail with reference to FIG. 5.

The base stations 105 may wirelessly communicate with the UEs 115 via one or more base station antennas. Each of the base stations 105 may provide communication coverage for a respective geographic coverage area 110. In some examples, base stations 105 may be referred to as a base transceiver station, a radio base station, an access point, a radio transceiver, a NodeB, eNodeB (eNB), Home NodeB, a Home eNodeB, a relay, or some other suitable terminology. The geographic coverage area 110 for a base station 105 may be divided into sectors or cells making up only a portion of the coverage area (not shown). The wireless communication network 100 may include base stations 105 of different types (e.g., macro base stations or small cell base stations, described below). Additionally, the plurality of base stations 105 may operate according to different ones of a plurality of communication technologies (e.g., 5G, 4G/LTE, 3G, Wi-Fi, Bluetooth, etc.), and thus there may be overlapping geographic coverage areas 110 for different communication technologies.

In some examples, the wireless communication network 100 may be or include a Long Term Evolution (LTE) or LTE-Advanced (LTE-A) technology network. The wireless communication network 100 may also be a next generation technology network, such as a 5G wireless communication network. In LTE/LTE-A networks, the term evolved node B (eNB) may be generally used to describe the base stations 105, while the term UE may be generally used to describe the UEs 115. The wireless communication network 100 may be a heterogeneous LTE/LTE-A network in which different types of eNBs provide coverage for various geographical regions. For example, each eNB or base station 105 may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

A macro cell may generally cover a relatively large geographic area (e.g., several kilometers in radius) and may allow unrestricted access by the UEs 110 with service subscriptions with the network provider.

A small cell may include a relative lower transmit-powered base station, as compared with a macro cell, that may operate in the same or different frequency bands (e.g., licensed, unlicensed, etc.) as macro cells. Small cells may include pico cells, femto cells, and micro cells according to various examples. A pico cell, for example, may cover a small geographic area and may allow unrestricted access by the UEs 115 with service subscriptions with the network provider. A femto cell may also cover a small geographic area (e.g., a home) and may provide restricted access and/or unrestricted access by the UEs 115 having an association with the femto cell (e.g., in the restricted access case, the UEs 115 in a closed subscriber group (CSG) of the base station 105, which may include the UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The communication networks that may accommodate some of the various disclosed examples may be packet-based networks that operate according to a layered protocol stack and data in the user plane may be based on the IP. A radio link control (RLC) layer may perform packet segmentation and reassembly to communicate over logical channels. A MAC layer may perform priority handling and multiplexing of logical channels into transport channels. The MAC layer may also use HARQ to provide retransmission at the MAC layer to improve link efficiency. In the control plane, the radio resource control (RRC) protocol layer may provide establishment, configuration, and maintenance of an RRC connection between a UE 115 and the base stations 105. The RRC protocol layer may also be used for core network 130 support of radio bearers for the user plane data. At the physical (PHY) layer, the transport channels may be mapped to physical channels.

The UEs 115 may be dispersed throughout the wireless communication network 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, an entertainment device, a vehicular component, or any device capable of communicating in wireless communication network 100. Additionally, a UE 115 may be Internet of Things (IoT) and/or machine-to-machine (M2M) type of device, e.g., a low power, low data rate (relative to a wireless phone, for example) type of device, that may in some aspects communicate infrequently with wireless communication network 100 or other UEs. A UE 115 may be able to communicate with various types of base stations 105 and network equipment including macro eNBs, small cell eNBs, relay base stations, and the like.

A UE 115 may be configured to establish one or more wireless communication links 125 with one or more base stations 105. The wireless communication links 125 shown in wireless communication network 100 may carry UL transmissions from a UE 115 to a base station 105, or downlink (DL) transmissions, from a base station 105 to a UE 115. The downlink transmissions may also be called forward link transmissions while the uplink transmissions may also be called reverse link transmissions. Each wireless communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. In an aspect, the communication links 125 may transmit bidirectional communications using frequency division duplex (FDD) (e.g., using paired spectrum resources) or time division duplex (TDD) operation (e.g., using unpaired spectrum resources). Frame structures may be defined for FDD (e.g., frame structure type 1) and TDD (e.g., frame structure type 2). Moreover, in some aspects, the communication links 125 may represent one or more broadcast channels.

In some aspects of the wireless communication network 100, base stations 105 or UEs 115 may include multiple antennas for employing antenna diversity schemes to improve communication quality and reliability between base stations 105 and UEs 115. Additionally or alternatively, base stations 105 or UEs 115 may employ multiple input multiple output (MIMO) techniques that may take advantage of multi-path environments to transmit multiple spatial layers carrying the same or different coded data.

The wireless communication network 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

As discussed above, a transport block or a codeword may be segmented into one or more code blocks prior to transmission. For example, if the transport block includes more information bits than the number of bits that a decoder is capable of decoding, the transport block may be segmented into one or more smaller code blocks. In some examples, the interleaving component 550 of a device (e.g., UE 115 or base station 105) may determine whether to perform a bit-level interleaving or tone-level interleaving to a data bit stream based on consideration of number of bits that are carried in each tone, size of the plurality of code blocks, a processing time requirements of the transmitting device, the transmitting device or a receiving device capabilities, available power at the receiving device, the transmitting device preference, the receiving device preference or combination thereof. In some examples, the interleaving component 550 may perform interleaving (e.g., bit-level interleaving) for each codeword separately. For example, if there are a plurality of codewords, each one may be mapped to a different layer and then use independent interleaving process for each OFDM symbol that determines the level of interleaving based on the performance and processing goals of the transmitting device, and the decoding capabilities of the receiving device.

Thus, in some examples, the interleaving component 550 may either perform coarse interleaving using tone-interleaver that may interleave a plurality of data resource elements across the bandwidth or perform refined interleaving using a bit-interleaver that performs interleaving of the bits that are inside each tone (e.g., resource element). Thus, in some examples, an input bit sequence may be segmented into a plurality of code blocks that comprises a plurality of bits. The bit-interleaver (see FIG. 5) that may be a subcomponent of interleaving component 550 may perform bit-interleaving per symbol for all the encoded data bits across the plurality of code blocks prior to the code blocks being mapped to resource elements for transmission. Additionally or alternatively, the tone-interleaver (see FIG. 5) that may also be a subcomponent of interleaving component 550 may perform tone-interleaving per symbol for each resource element after the code blocks have been mapped to their corresponding resource elements in the resource grid of a subframe.

In some aspects, the mapped symbols may be transmitted over a wireless channel and used by the receiving device to calculate a posteriori probability for the received bits (e.g., the likelihood of the received bit being either "0" or "1"). In some examples, the receiving device may calculate the posteriori probability by expressing the probability in terms of log-likelihood ratio (LLR), that may also be referred to as L-value to generate 'soft-information" for the received bits that may provide the receiving device with foresight of the received bits prior to signal processing. The L-values may be interleaved and passed to the channel decoder for further processing.

Figure 2:
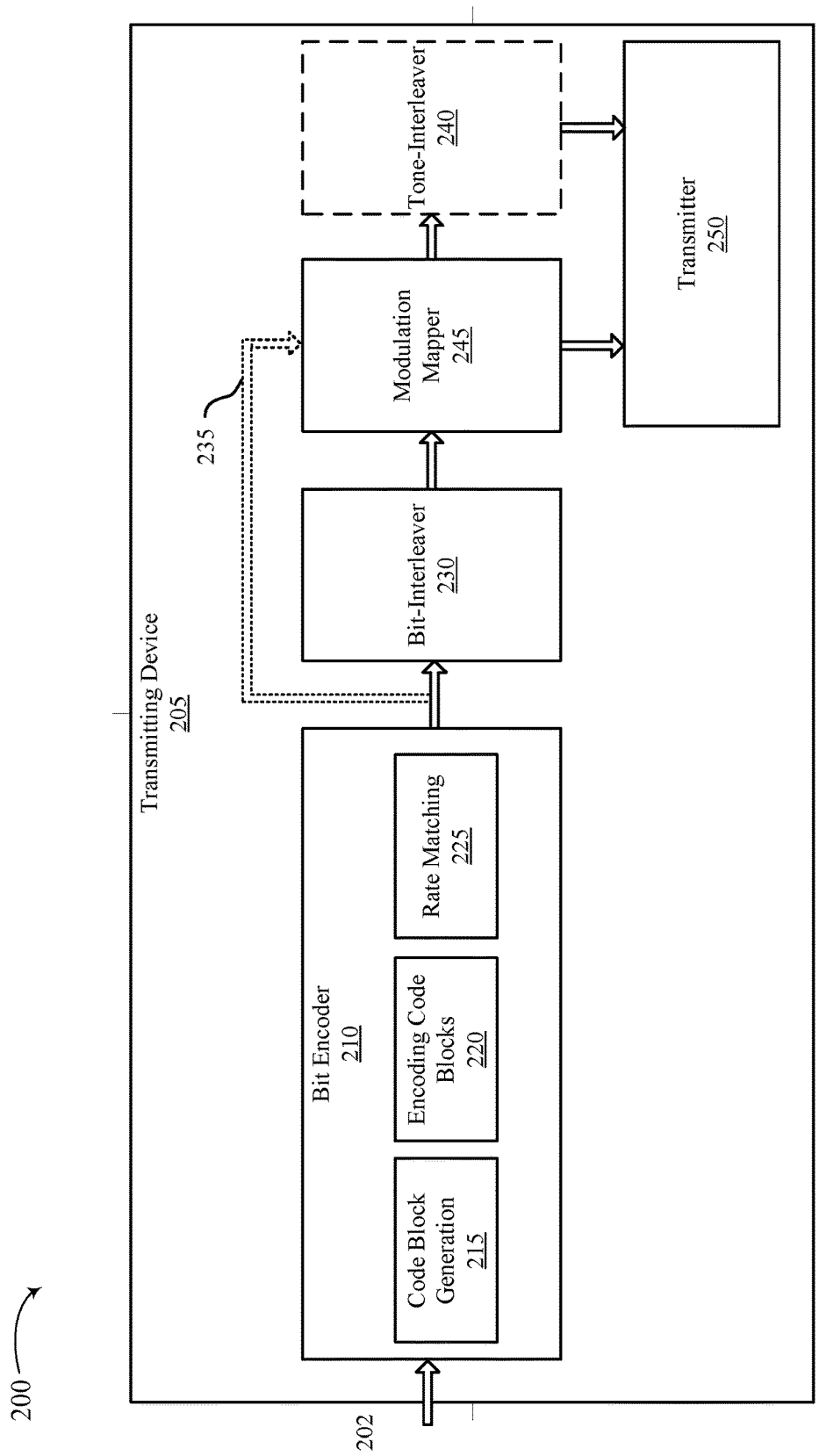
FIG. 2 illustrates a schematic diagram of a transmitting device for interleaving data bits or tones in accordance with aspects of the present disclosure.

FIG. 2 illustrates a schematic diagram 200 of a transmitting device 205 for interleaving data bits by way of bit-interleaver 230 and/or data tones by way of tone-interleaver 240 in accordance with aspects of the present disclosure. In some examples, the transmitting device 205 may be a UE 115 or a base station 105 as shown in FIG. 1. As discussed above, aspects of the present disclosure provide techniques for performing bit-level interleaving for each symbol across a plurality of code blocks. In some aspects, a transmitting device may dynamically switch between bit-level interleaving and tone-level interleaving for each symbol based on factors such as number of bits that are carried in each tone, size of each code block, the processing time requirements of the transmitting device and/or the receiving device, or the transmitting device preference. Additionally, the features of the present disclosure allow for the transmitting device to elect not to interleave the code blocks, and thus the plurality of code blocks are transmitted to the receiving device over the wireless link without performing any interleaving. For example, the transmitting device may elect not to interleave when the spectral efficiency may be relatively small (e.g., low geometry, low rank, and/or low MCS). In such situation, one code block may span across a large portion of the resource elements of an OFDM symbol. As such, electing against interleaving may provide performance gains because the code block already may take advantage of the frequency diversity. For the purposes of this disclosure, the term "interleaving" may be used to describe a technique employed to reduce the impact of burst errors on a signal by either reordering the sequence of the data bits in a bit stream across a plurality of code blocks prior to mapping the complex-valued modulation symbols for each antenna port to corresponding resource elements of a bandwidth in case of "bit-level interleaving," or reordering the data resource elements (e.g., resource elements that are allocated to data bits) associated with the one or more code blocks after the resource element mapping process in case of "tone-level interleaving."

In some examples, a bit encoder 210 may encode bits to generate encoded bits for a plurality of code blocks by first segmenting a transport block 202 into a plurality of code blocks 215, each code block having a size that conforms with the capabilities of the interleaver (e.g., bit-interleaver 230 or tone-interleaver 240) and the receiver device. In some examples, the size of the code blocks may vary based on the number of data bits included in each transport block 202. The bit encoder 210, at 220, may encode each code block with the plurality of bits (data bits and/or control bits) and perform rate matching 225. The rate matching 225 may create an output bit stream with a desired code rate. As the number of bits available for transmission depends on the available resources, the rate matching algorithm may be capable of producing any arbitrary rate to meet the transmitting device 205 requirements.

In some aspects, based on the determination of whether to select bit-level interleaving or tone-level interleaving for each symbol, the transmitting device may either interleave the bit stream prior to performing modulation mapping by modulation mapping component 245 (e.g., in case of bit-level interleaving) or after performing modulation mapping by modulation mapping component 245 (e.g., in case of tone-level interleaving). If the bit-level interleaving is selected, the encoded bit stream may forwarded to the bit-interleaver 230 to interleave the encoded bits across the plurality of code blocks to generate interleaved encoded bits. Thus, in some aspects, data bits from one code block may be reorganized in a different code block, and vice versa in order to improve bit diversity.

In some examples, the bit-interleaver 230 may either perform row-column interleaving that may depend on the code block size of the plurality of code blocks or depth interleaving that may be independent of the size of the code blocks.

In a k-bit Row-Column (RC) interleaver process, each interleaving block (e.g., an effective size of an interleaving block) may be written to available resources in columns, but may be read in rows and vice versa. In some examples, the value of the effective size may be counted in terms of number of bits. In some examples, the effective size of the interleaving block ("k") is an integer value greater than or equal to one (e.g., k=1, 2, 3 . . . 10, 12 etc.). In some aspects, when the value of k=12, the tone-interleaver may alternatively be referred to as "resource block (RB) interleaver). The interleaving block may refer to a subset of data bits that may collectively be shifted to a different portion of a code block from the plurality of code blocks. For example, a first interleaving block having an effective size of two (e.g., 2 bits) from a first code block may be shifted to 2 bit location in a second code block. Subsequently, each of the plurality of code blocks may be mapped to one or more RBs before being transmitted over the wireless channel to the receiving device.

Additionally or alternatively, in some examples, the effective size of the interleaving block may equal to the number of bits in an OFDM. For example, if the effective size of the interleaving block equals to the total number of bits in one OFDM symbol, the transmitting device may omit performing any interleaving on the specified OFDM symbol.

Figure 3A:
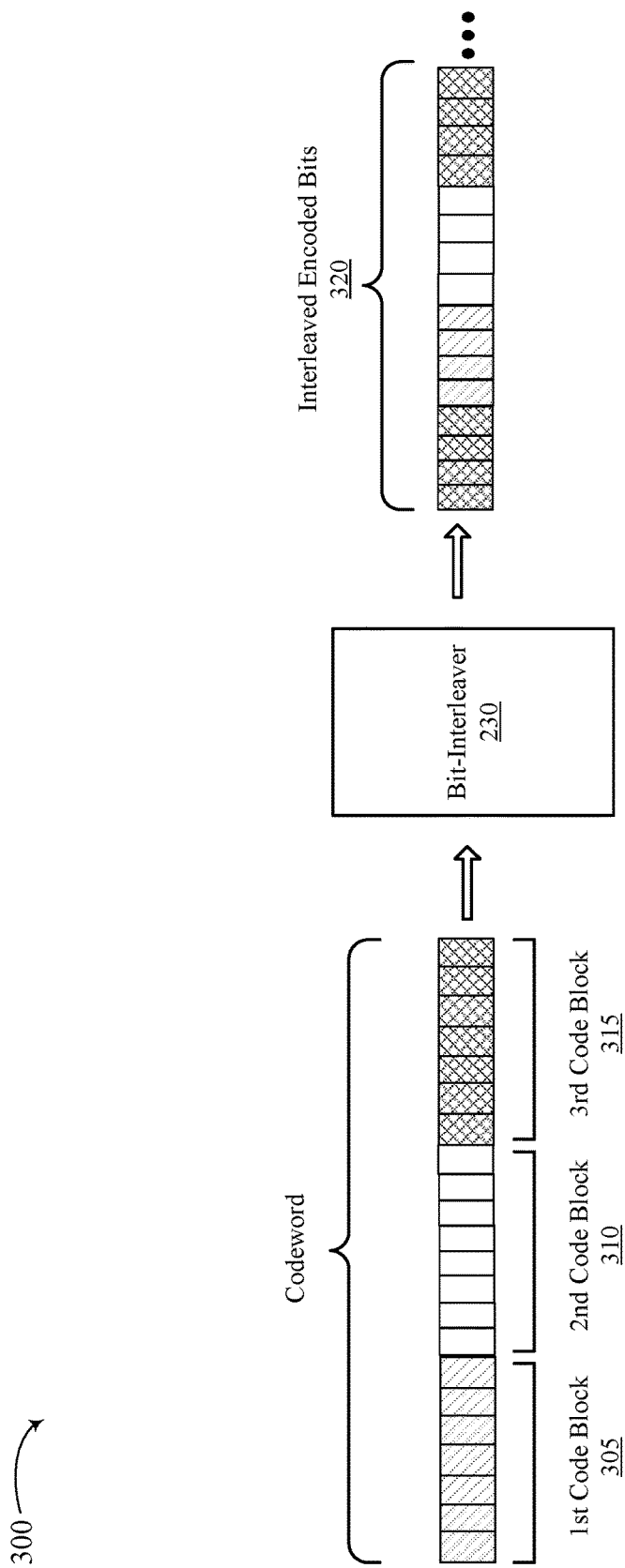
FIG. 3A illustrates a bit-level interleaving process in accordance with aspects of the present disclosure.
Figure 3B:
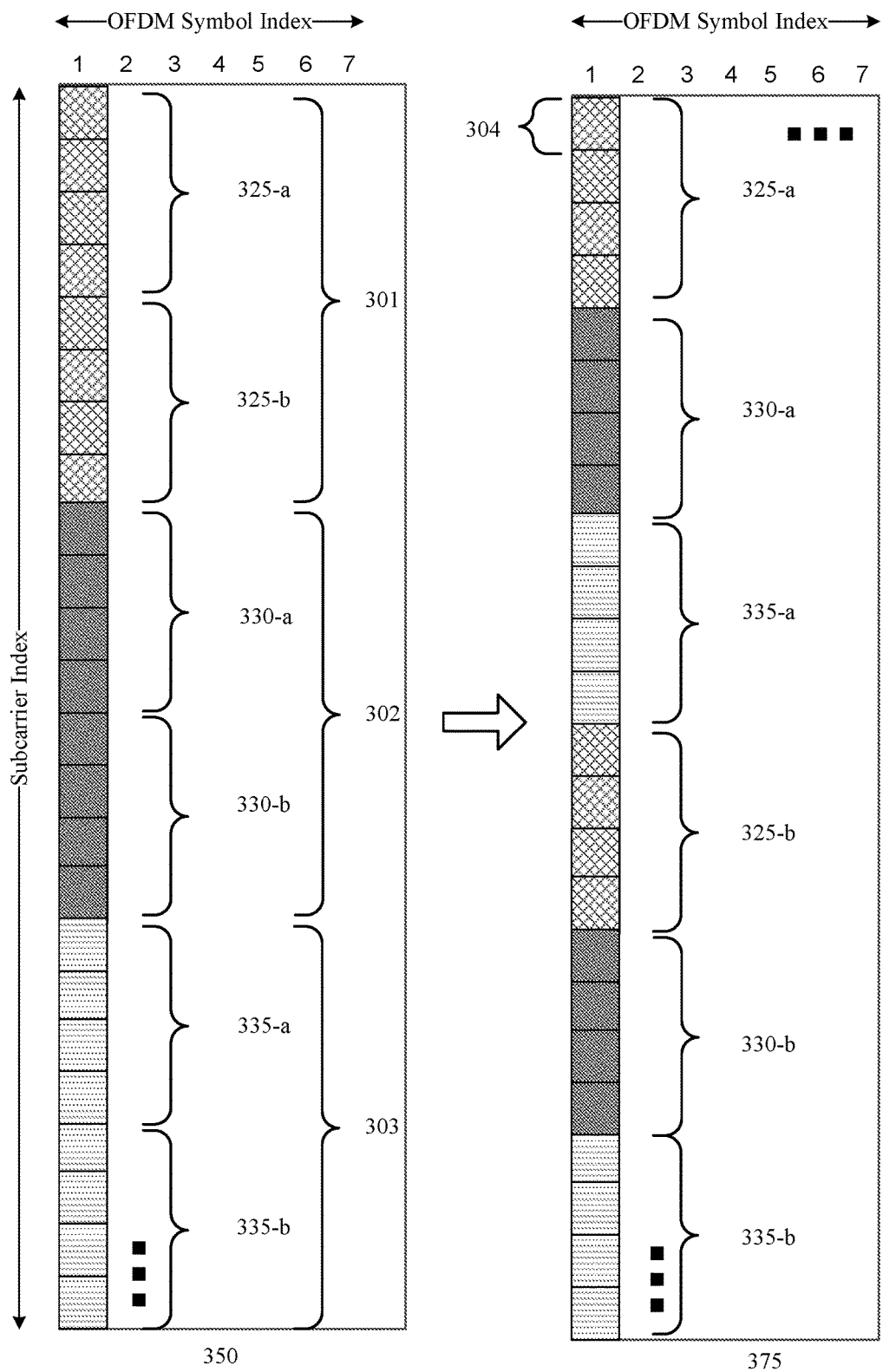
FIG. 3B illustrate a tone-level interleaving process in accordance with aspects of the present disclosure.
Figure 3C:
FIG. 3C illustrates a row-column interleaver utilized by either the bit-level interleaving process or the tone-level interleaving process to reorder the data in rows and columns in accordance with aspects of the present disclosure.

To perform the RC interleaving process, the bit-interleaver may calculate a number of rows and columns for an interleaver matrix 380 (see e.g., FIG. 3C). The interleaving block bits may then be written to different portions of the code blocks of the plurality of code blocks of the interleaver matrix in a first order (e.g., first along the columns and then along the rows) and interleaved by reading the written elements from the interleaver matrix in a second, different order (e.g., first along the rows and then along the columns).

To determine the interleaver matrix, the number of rows ($N_{rows}$) for the interleaver matrix may be calculated as follows:

$$N_{rows} = N_{k-bits\ per\ CB} = \left\lceil \frac{N_{CB\ bits}}{k} \right\rceil \quad \text{Equation 1}$$

In Equation 1, N is the number of encoded bits (i.e., bits to be mapped) per code block (CB), $N_{CB\ bits}$ is the number of bits per code block (e.g., after performing rate matching), and k is the default number of bits in each interleaving block. Using the calculated number of rows for interleaver matrix, the number of columns ($N_{cols}$) may be calculated as follows:

$$N_{cols} = \left\lceil \frac{N_{k-bits}}{N_{k-bits\ per\ CB}} \right\rceil \quad \text{Equation 2}$$

In Equation 2, $N_{k-bits\ per\ CB}$ is the number of rows calculated from Equation 1, $N_{k-bits}$ may be all bits to be transmitted, and k is the default number of bits in each interleaving block. Thus, if each code block has a code block size of eight (8), for example, and the default value of the k is 4-bits (e.g., 4-bit interleaver), then the $N_{k-bits\ per\ CB}$ may be 2 (i.e., $N_{rows}$), $N_{k-bits}$ may be six (6), and $N_{cols}$ may be three (3).

Thus, in some aspects, the RC interleaver process as employed for bit-interleaving may separate bits from the same code blocks as much as possible (e.g., across the plurality of code blocks).

Alternatively, a depth based bit-interleaver may interleave the bits independent of the size of the plurality of code blocks. The advantage of the depth based bit-interleaver over RC interleaver process may be reflected in lower hardware and implementation complexity at the cost of reduced performance. In some aspects, the depth based bit-interleaver may either use a pseudo-random seed at the transmitting device and/or receiving device to interleave and de-interleave the bit interleaving blocks for each symbol. In some examples, the pseudo-random seed may be either same for each OFDM symbol or a different pseudo-random seed may be selected for each symbol. In some examples, the pseudo-random seed may depend on one or more of: the UE identification (ID), the cell ID (ID), virtual cell ID, slot ID, subcarrier spacing, the subframe ID, the frame ID, the symbol index inside the subframe, or a combination thereof.

In some aspects, the bit-interleaver 230 employing the depth based bit interleaving process may identify an effective depth value of an interleaving block for an OFDM symbol in order to move consecutive bit packets a specified distance from each other. For example, an effective depth value of ten (10) may indicate that the first interleaving block bits will be moved to the tenth position in the bit sequence, while the second interleaving block bits will be moved to the twenty first position, and the third interleaving block bits to the thirty first, and so on. Assuming there are sufficient total number of bits for transmission, the depth based bit interleaving process may ensure that bits are separated by a constant distance (determined based on the effective depth value). Thereafter, the interleaved encoded bits may be forwarded to the modulation mapping component 245 to map the one or more OFDM symbols to the allocated physical resource elements before transmission over the wireless channel by the transmitter 250.

However, if a tone-interleaver 240 is selected, the encoded bit sequence generated by the bit encoder 210 may bypasses (e.g., bypass 235) the bit-interleaver 230, and is forwarded to the modulation mapper 245 that may map the symbols to the allocated physical resource elements. Thus, while a transmitting device 205 may include both a bit-interleaver 230 and tone-interleaver 240, the transmitting device 205 may select at least one of the two interleavers while the other may be bypassed or operated in a bypass mode. Although FIG. 2 illustrates the bypass 235, it should be appreciated that the bit-interleaver 230 and/or tone-interleaver 240 may alternatively operate in a bypass mode without redirecting the flow of traffic to specific interleaver. The mapped data resource elements may thus be interleaved thereafter by the tone-interleaver 240 (as described in detail with reference to FIG. 3B) prior to being transmitted over the wireless channel by the transmitter 250.

FIG. 3A illustrates a bit-level interleaving process 300 in accordance with aspects of the present disclosure. In some examples, a codeword 202 comprising a plurality of code blocks (e.g., 305, 310, 315) may be encoded by the transmitting device 205 described with reference to FIG. 2. In some examples, each of the plurality of code blocks (e.g., 305, 310, 315) may have a specified code block size that satisfies the maximum and minimum parameters of the transmitting device and the receiving device. In some aspects, each code block may further include a plurality of data bits organized in an initial sequence.

The bit-interleaver 230 may perform bit-level interleaving process on the plurality of code words in order to interleave the encoded bits 320 across the plurality of code blocks to generate interleaved encoded bits. Thus, as illustrated, bits from a first code block 305 may be interleaved into one or more of second code block 310 and/or third code block 315, and vice versa. The bit-interleaver 230 may employ either the RC interleaving process or the depth based interleaving process in order to achieve the required performance goals of the transmitting device.

FIG. 3B illustrate a subframe structure that implements one or more techniques of tone-interleaving data resource elements in each of a plurality of OFDM symbols (0, 1, 2, 3, etc.) of a subframe by a tone-interleaver (e.g., tone-interleaver 240). As noted above, in some examples, one or more data resource elements 304 may be grouped in resource blocks (e.g., 325, 330, 335) in one or more OFDM symbols. A resource element 304 may be defined as a unit which consists of one OFDM sub-carrier during one OFDM symbol interval.

In some examples, subframe structure 350 may represent the initial resource element allocations for data bits across a single OFDM symbol interval. However, transmitting the subframe with low frequency diversity of the data bits may result in the receiver device being unable to properly decode the received subframe in situations of poor channel conditions. As such, achieving frequency diversity (e.g., spreading data in the frequency domain across the available bandwidth) may alleviate concerns of none of the data bits being received by the receiver device (e.g., UE or base station). Aspects of the present disclosure provide techniques for interleaving data resource elements across the available bandwidth to achieve greater frequency diversity even by using tone-interleaving process, as illustrated by subframe structure 375.

In some examples, an effective size of an interleaving block may represent a number of resource elements that are collectively shifted from one region of the bandwidth to a different region of a bandwidth (e.g., from first four resource elements in the first OFDM symbol to second four resource elements). In the interleaving process illustrated in FIG. 3B, three set of data (301, 302, and 303) are segmented into six groups of resource elements (325-*a*, 325-*b*, 330-*a*, 330-*b*, 335-*a*, and 335-*b*), and each group of resource element (e.g., 325-*a*) has four resource elements that may be referred to as the "size of an interleaving block" that may further include a plurality of bits corresponding to code blocks. Thus, in terms of interleaving, the size of an interleaving block of four may represent that four resource elements that carry data are shifted to position of some other four resource elements that carry data. In some examples, the subframe structure 350 may represent the initial or default resource allocations. In such instance, the size of four resource elements for the size of an interleaving block may be based on the default size of an interleaving block that is determined based in part on the hardware capabilities of the UE and the base station.

However, as the techniques of the present disclosure are implemented, the size of the interleaving block may change from the default size of an interleaving block to an effective size of an interleaving block based on the number of control resource elements in the group of resource elements (e.g., 325-*a*, 330-*a*, 335-*a*, etc.) in different regions of the bandwidth. In other examples, as in the present case of FIG. 3B, the effective size of the interleaving block may remain the same as the default size of the interleaving block because there are no control resource elements in any group of resource elements in any region of the bandwidth.

Thus, the first resource block 325-*a* of the first data set 301 may be mapped to the first four resource elements of the subframe structure 375. However, by interleaving the data tones, the second resource block 325-*b* of the first data set 301 does not sequentially map to the next four resource elements. Instead, the transmitting device may interleave the first resource block 330-*a* of the second data set 302 to the next four resource elements, followed by the first resource block 335-*a* of the third data set 303. After mapping the last of the data sets, the interleaving process may return to the second resource block 325-*b* of the first data set 301 to be mapped to the subsequent four resource elements, followed by the second resource block 330-*b* of the second data set 302 and so forth until all the data tone resource elements are interleaved to achieve the desired frequency diversity.

To perform the interleaver process described above (e.g., bit-interleaving or tone-interleaving), either the bits or data resource elements may be interleaved by calculating a number of rows and columns for an interleaver matrix 380 as illustrated in FIG. 3C. The data bits or data resource elements may then be written to elements of the interleaver matrix 380 in a first order (e.g., first along the columns and then along the rows) and interleaved by reading the written elements from the interleaver matrix 380 in a second, different order (e.g., first along the rows and then along the columns). In some examples, the transmitting device may identify the number of rows and number of columns for the interleaver matrix 380 based on hardware capabilities of the transmitting device and the receiving device, in addition to the consideration of the performance goals (e.g., whether to achieve higher frequency diversity at the cost of lower energy efficiency).

Once the number of rows and columns are calculated, the data bits or data resource elements of the one or more code blocks may be written in interleaver matrix 380 as shown in FIG. 3C. In this example, the number of columns (calculated as three) and the number of rows (calculated as two) make up the interleaver matrix 380 shown in FIG. 3C. The data bits or resource elements of each of code blocks may be written in elements in a column direction 355, as shown. Thus, when reading the written elements in a different direction, such as reading in a row direction 360, as shown, the bits or tones of the one or more code blocks may be interleaved between one another. For example, as shown with reference to FIGS. 3B and 3C, the tones of one code block are written in the column direction 355 and read in the row direction 360 and the interleaved code blocks may be mapped to resource blocks in the order in which the tones were read from interleaver matrix 380. Thus, as the receiving device would decode and read the subframe structure, the receiver would read the resource blocks in the following order: the first resource block 325-*a* of the first data set 301, the first resource block 325-*a* of the second data set 302, the first resource block 330-*a* of the third data set 303, the second resource block 325-*a* of the first data set 301, the second resource block 330-*b* of the second data set 302, and the third resource block 335-*b* of the third data set 303.

For purposes of bit-interleaving, the bits of code blocks are similarly written in the column direction 355 and read in the row direction 360 and the interleaved code blocks may be mapped to resource elements in the order in which the bits are read from interleaver matrix 380. Thus, the output of the bit-interleaver 230 (and prior to the code blocks being mapped to resource elements), the interleaved bits may be read in the following order: the first resource block 325-*a* of the first data set 301, the first resource block 325-*a* of the second data set 302, the first resource block 330-*a* of the third data set 303, the second resource block 325-*a* of the first data set 301, the second resource block 330-*b* of the second data set 302, and the third resource block 335-*b* of the third data set 303.

While the data bits or resource elements of the one or more code blocks in the illustrated example may be written in a column direction 355 and read in a row direction 360 as illustrated, in other examples the bits or tones may be written in a row direction and read in a column direction. In other examples, the tones may be written in any predetermined order and read in any predetermined order, which may be different from the order in which the bits or tones were written.

In some examples, after the one or more data resource elements of the code blocks are interleaved and mapped to available resources, the mapped code blocks may then be transmitted from a transmitting device (e.g., UE 115 or base station 105) to a receiving device (e.g., UE 115 or base station 105). Once received by the receiving device, the receiving device may perform a de-interleaving process (e.g., a reverse interleaving process) process as part of the process to decode the one or more code blocks.

Figure 4:
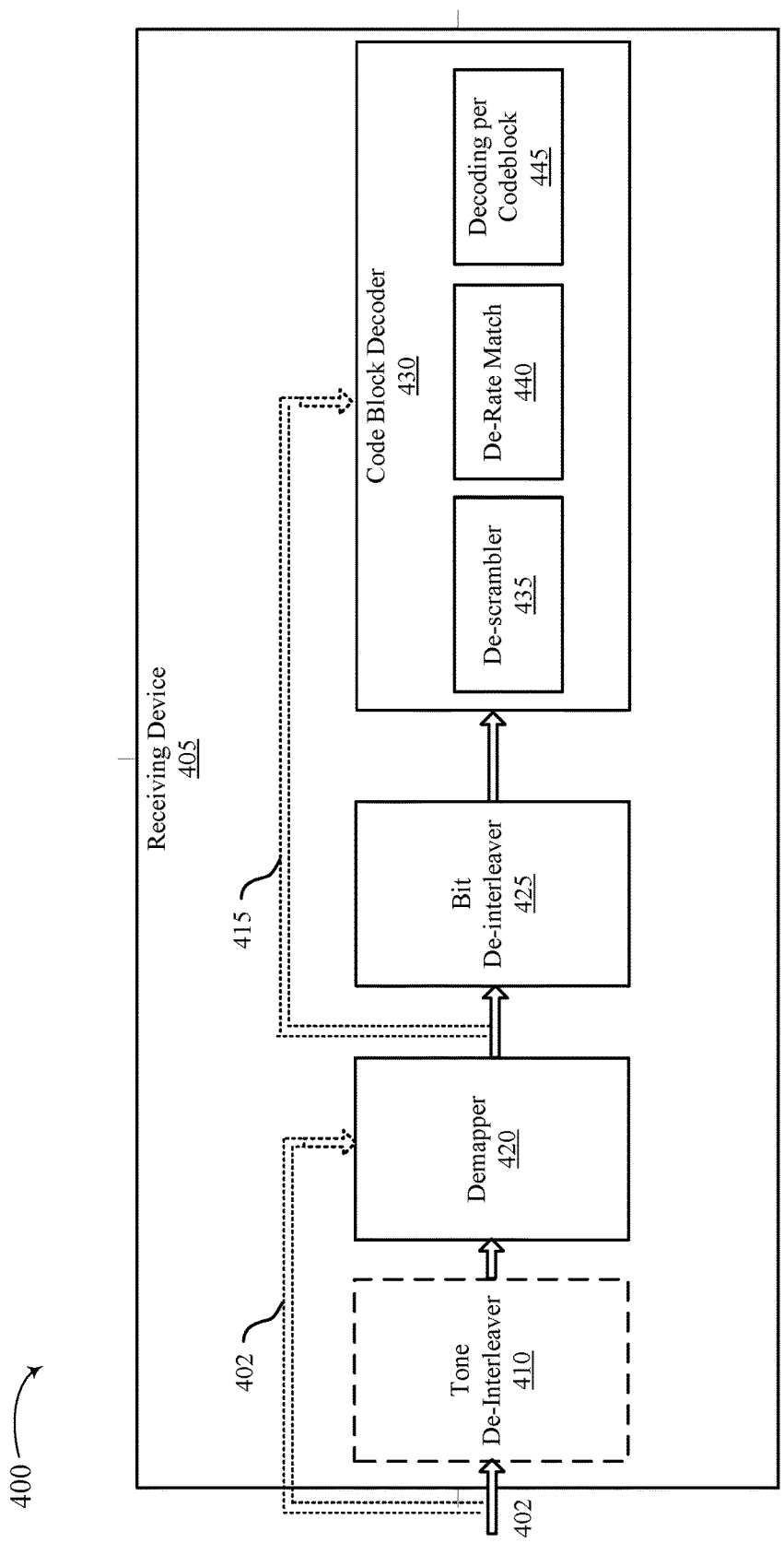
FIG. 4 illustrates a schematic diagram of a receiving device for de-interleaving data bits or tones in accordance with aspects of the present disclosure.

FIG. 4 illustrates a schematic diagram 400 of a receiving device 405 for de-interleaving received signal 402 in accordance with aspects of the present disclosure. In some examples, the receiving device 405 may be either a UE 115 or a base station 105 as described with reference to FIG. 1. Once the modulated signal is transmitted from the transmitting device (e.g., UE 115 or base station 105) and received by the receiving device 405 (e.g., UE 115 or base station 105) at the receiver 401, the receiving device 405 may process the received signal to decode the symbols and de-interleave the bits or resource elements depending on whether a bit-interleaver or tone-interleaver were employed by the transmitting device during transmission. If the transmitting device employs a tone-interleaver, the received signal 402 may be first forwarded to the tone de-interleaver 410 to de-interleave the data resource elements prior to forwarding the information to the demapper 420. Further, in such case, the demapper 420 may bypass 415 the bit de-interleaver 425 and forward the soft-information to the bit decoder 430 for processing.

If, however, a bit-interleaver is employed by the transmitting device, the receiving device 405 may forward the received signal 402 directly to the demapper 420 (bypassing the tone de-interleaver 410) to generate soft-information (e.g., log-likelihood ratios (LLRs) regarding the received signal 402. In some examples, the soft-information may refer to the posteriori probabilities of the transmitted/received bits expressed in the form of LLR (also known as L-value) that identifies the likelihood of a bit in the received signal 402 being a particular value (e.g., 0 or 1). The L-value may be forwarded to the bit de-interleaver 425 to restore the original order of the bit stream as generated by the transmitting device prior to the interleaving process initiated by the transmitting device. The de-interleaved bits may be forwarded to bit decoder 430 that may de-scramble 435 the bit stream, de-rate match 440, and decode each code block 445. In some examples, the receiving device 405 may include a receiver such as the receiver 506 described with reference to FIG. 5.

Figure 5:
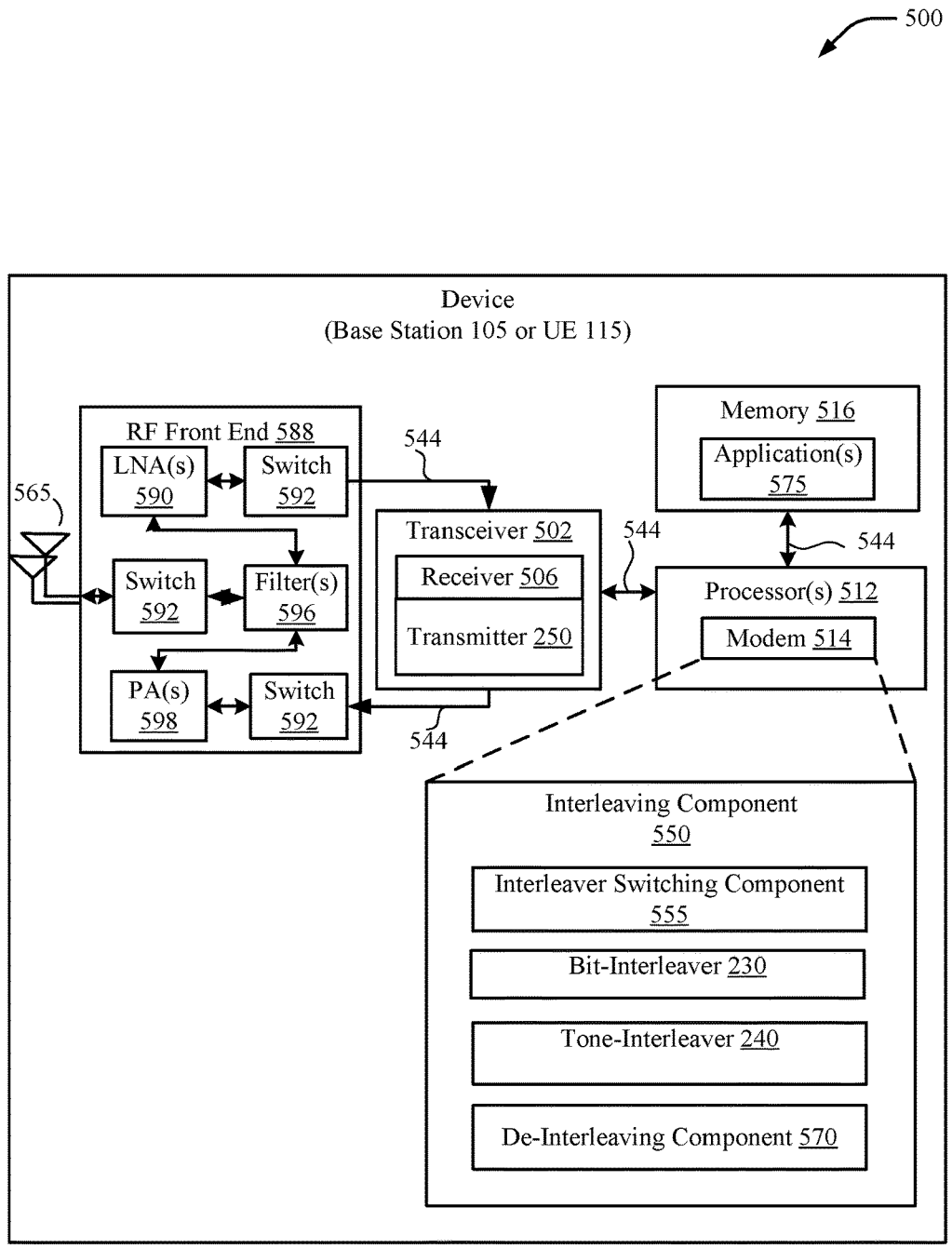
FIG. 5 is a schematic diagram of an aspect of an implementation of various components of a device (e.g., UE or base station) in accordance with various aspects of the present disclosure.

FIG. 5 describe hardware components and subcomponents of a device that may be a transmitting device (e.g., a UE 115 or base station 105) or a receiving device (e.g., a UE 115 or base station 105) for implementing one or more methods (e.g., method 600) described herein in accordance with various aspects of the present disclosure. For example, one example of an implementation of the transmitting device may include a variety of components, some of which have already been described above, but including components such as one or more processors 512 and memory 516 and transceiver 502 in communication via one or more buses 544, which may operate in conjunction with the interleaving component 550 to enable one or more of the interleaving functions described herein related to including one or more methods of the present disclosure. The processor 512 and memory 516 may additionally or alternatively include a de-interleaving component 570 to enable one or more of the de-interleaving functions (e.g., identifying soft-information of the received bits) described herein related to one or more methods of the present disclosure. It should be appreciated that the de-interleaving component 570 can be part of the interleaving component 550 or a separate component of the device (transmitting or receiving). In some examples, the interleaving component 550 and the de-interleaving component 570 may be part of the same device (e.g., UE 115 or base station 105) such that the device may operate as both a transmitting device and a receiving device in the network. Further, the one or more processors 512, modem 514, memory 516, transceiver 502, RF front end 588 and one or more antennas 565, may be configured to support voice and/or data calls (simultaneously or non-simultaneously) in one or more radio access technologies.

In an aspect, the one or more processors 512 can include a modem 514 that uses one or more modem processors. The various functions related to interleaving component 550 may be included in modem 514 and/or processors 512 and, in an aspect, can be executed by a single processor, while in other aspects, different ones of the functions may be executed by a combination of two or more different processors. For example, in an aspect, the one or more processors 512 may include any one or any combination of a modem processor, or a baseband processor, or a digital signal processor, or a transmit processor, or a receiver processor, or a transceiver processor associated with transceiver 502. In other aspects, some of the features of the one or more processors 512 and/or modem 514 associated with interleaving component 550 may be performed by transceiver 502. The interleaving component 550 may further include an interleaver switching component 555 for dynamically switching between bit-level interleaving or tone-level interleaving based on one or more considerations identified above. As such, the interleaver selector 560 may select one of the plurality of interleavers to perform interleaving on the encoded bits either prior to mapping (in case of bit-level interleaving) or after the mapping (in case of tone-level interleaving) of the control blocks to the resource elements.

Also, memory 516 may be configured to store data used herein and/or local versions of applications or interleaving component 550 and/or one or more of its subcomponents being executed by at least one processor 512. Memory 516 can include any type of computer-readable medium usable by a computer or at least one processor 512, such as random access memory (RAM), read only memory (ROM), tapes, magnetic discs, optical discs, volatile memory, non-volatile memory, and any combination thereof. In an aspect, for example, memory 516 may be a non-transitory computer-readable storage medium that stores one or more computer-executable codes defining interleaving component 550 and/or one or more of its subcomponents, and/or data associated therewith, when UE 115 is operating at least one processor 512 to execute interleaving component 550 and/or one or more of its subcomponents.

Transceiver 502 may include at least one receiver 506 and at least one transmitter 508. Receiver 506 may include hardware, firmware, and/or software code executable by a processor for receiving data, the code comprising instructions and being stored in a memory (e.g., computer-readable medium). Receiver 506 may be, for example, a radio frequency (RF) receiver. In an aspect, receiver 506 may receive signals transmitted by at least one base station 105. Additionally, receiver 506 may process such received signals, and also may obtain measurements of the signals, such as, but not limited to, Ec/Io, SNR, RSRP, RSSI, etc. Transmitter 250 may include hardware, firmware, and/or software code executable by a processor for transmitting data, the code comprising instructions and being stored in a memory (e.g., computer-readable medium). A suitable example of transmitter 508 may including, but is not limited to, an RF transmitter.

Moreover, in an aspect, transmitting device may include RF front end 588, which may operate in communication with one or more antennas 565 and transceiver 502 for receiving and transmitting radio transmissions, for example, wireless communications transmitted by at least one base station 105 or wireless transmissions transmitted by UE 115. RF front end 588 may be connected to one or more antennas 565 and can include one or more low-noise amplifiers (LNAs) 590, one or more switches 592, one or more power amplifiers (PAs) 598, and one or more filters 596 for transmitting and receiving RF signals.

In an aspect, LNA 590 can amplify a received signal at a desired output level. In an aspect, each LNA 590 may have a specified minimum and maximum gain values. In an aspect, RF front end 588 may use one or more switches 592 to select a particular LNA 590 and its specified gain value based on a desired gain value for a particular application.

Further, for example, one or more PA(s) 598 may be used by RF front end 588 to amplify a signal for an RF output at a desired output power level. In an aspect, each PA 598 may have specified minimum and maximum gain values. In an aspect, RF front end 588 may use one or more switches 592 to select a particular PA 598 and its specified gain value based on a desired gain value for a particular application.

Also, for example, one or more filters 596 can be used by RF front end 588 to filter a received signal to obtain an input RF signal. Similarly, in an aspect, for example, a respective filter 596 can be used to filter an output from a respective PA 598 to produce an output signal for transmission. In an aspect, each filter 696 can be connected to a specific LNA 590 and/or PA 598. In an aspect, RF front end 588 can use one or more switches 592 to select a transmit or receive path using a specified filter 596, LNA 590, and/or PA 598, based on a configuration as specified by transceiver 502 and/or processor 612.

As such, transceiver 502 may be configured to transmit and receive wireless signals through one or more antennas 565 via RF front end 588. In an aspect, transceiver may be tuned to operate at specified frequencies such that transmitting device can communicate with, for example, one or more base stations 105 or one or more cells associated with one or more base stations 105. In an aspect, for example, modem 514 can configure transceiver 502 to operate at a specified frequency and power level based on the configuration of the transmitting device and the communication protocol used by modem 514.

In an aspect, modem 514 can be a multiband-multimode modem, which can process digital data and communicate with transceiver 502 such that the digital data is sent and received using transceiver 502. In an aspect, modem 514 can be multiband and be configured to support multiple frequency bands for a specific communications protocol. In an aspect, modem 514 can be multimode and be configured to support multiple operating networks and communications protocols. In an aspect, modem 514 can control one or more components of transmitting device (e.g., RF front end 588, transceiver 502) to enable transmission and/or reception of signals from the network based on a specified modem configuration. In an aspect, the modem configuration can be based on the mode of the modem and the frequency band in use. In another aspect, the modem configuration can be based on UE configuration information associated with transmitting device as provided by the network during cell selection and/or cell reselection.

In some examples, interleaving the data bits may include interleaving the encoded bits across the plurality of code blocks to generate interleaved encoded bits prior to mapping the interleaved encoded bits to a plurality of resource elements in an OFDM symbol. In other examples, interleaving the data resource elements may include interleaving the first data in the first group of resource elements and the second data in the second group of resource elements by executing interleaving hardware having a default size of interleaving block and producing an interleaved OFDM symbol that has the effective size of the interleaving block.

Figure 6:
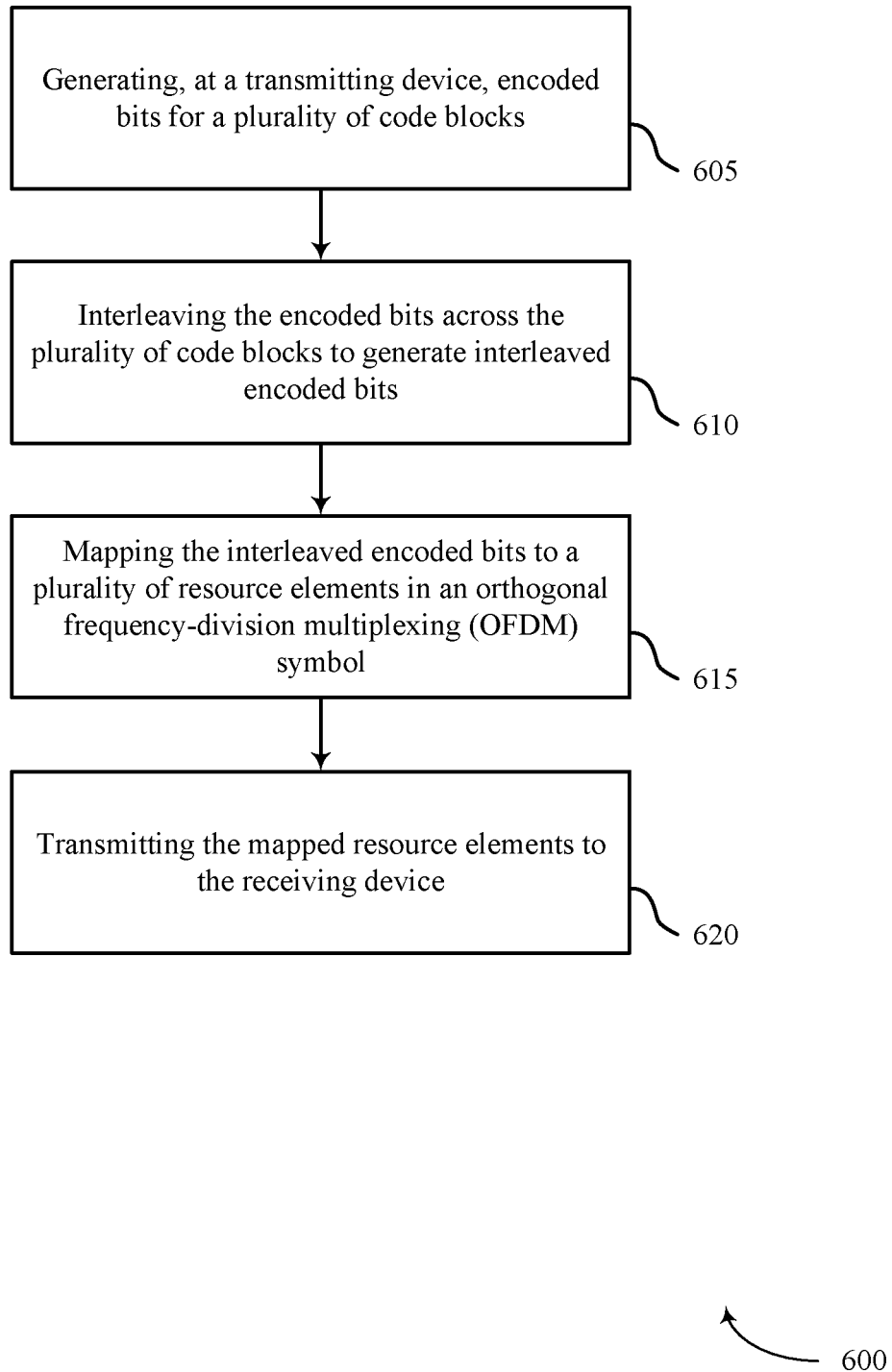
FIG. 6 illustrates a method of interleaving in accordance with aspects of the present disclosure

FIG. 6 is a flowchart of an example method 600 for transmitting information (e.g., subframes) in wireless communications in accordance with aspects of the present disclosure. For purposes of the present disclosure, the term "subframe," as used herein, may refer to a time-duration or a slot as contemplated in the 5G NR communications technology. For example, a scheduling unit may identify a slot (or a "mini-slot") that can have variable sizes. For instance, a slot may be 7 or 14 OFDM symbols, and a mini-slot may be fewer than the 7 or 14 OFDM symbols. The method 600 may be performed using an apparatus (e.g., the UE 115 or base station 105, for example). Although the method 600 is described below with respect to the elements of the UE 115 or the base station 105, other components may be used to implement one or more of the steps described herein.

At block 605, the method 600 may include generating, at a transmitting device, encoded bits for a plurality of code blocks. Aspects of block 605 may be performed by bit encoder 210 described with reference to FIG. 2.

At block 610, the method 600 may include interleaving the encoded bits across the plurality of code blocks to generate interleaved encoded bits. As noted above, the interleaving may occur on a symbol-by-symbol basis. In some examples, the interleaving of the encoded bits across the plurality of code blocks may be in response to the determining whether to perform bit-level interleaving or tone-level interleaving. In some examples, determining whether to perform the bit-level interleaving or the tone-level interleaving is based on one or more of: a number of bits that are carried in each tone, a size of the plurality of code blocks, a processing time requirements, a transmitting device preference, or a combination thereof. Additionally or alternatively, the determining whether to perform the bit-level interleaving or the tone-level interleaving may be determined for each subframe. In other words, for each subframe or for each symbol, the transmitter may dynamically switch (e.g., select a different interleaver) based on the performance requirements identified above.

In some examples, with respect to bit-level interleaving, interleaving the encoded bits across the plurality of code blocks to generate the interleaved encoded bits may comprise determining an effective size of an interleaving block based on a code block size of the plurality of code blocks (e.g., for Row-Column K-Bit Interleaver), and interleaving the encoded bits across the plurality of code blocks to generate the interleaved encoded bits based on the effective size of the interleaving block. In some examples, the effective size of the interleaving block may be a number of bits that are collectively shifted to a different portion of a code block from the plurality of code blocks. As illustrated above, it should be appreciated that features of the present disclosure provide inter-code block interleaving techniques for bit-interleaving across code blocks carried in each OFDM symbol (i.e., symbol-by-symbol). In accordance with "inter-code block interleaving," the bit level interleaving occurs inside each OFDM symbol. In contrast, intra-code block interleaving may refer to interleaving inside the code block (i.e., not on a symbol-by-symbol basis).

In other examples, the transmitting device may interleave the encoded bits across the plurality of code blocks to generate interleaved encoded bits independent of a code block size of the one or more code blocks (e.g., when using depth based bit-interleaver). In such examples, the transmitting device may determine an effective depth of an interleaving block for the OFDM symbol, and interleave the encoded bits across the plurality of code blocks to generate the interleaved encoded bits based on the effective depth of the interleaving block. The effective depth of the interleaving block may be a number of bits in the interleaving stream of bits that separate the consecutive interleaving blocks of the initial stream of bits. In some examples, the effective depth may be an integer value greater than or equal to one (1). The integer value may be either determined by the transmitter, suggested by the receiver (e.g., via a signal to the transmitter), or be pre-defined by the transmitter. In some examples, the integer value for the effective depth may be based on the allocation of the UE or dynamically adjustable per symbol. Aspects of block 610 may be performed by bit-interleaver 230 described with reference to FIG. 3A.

At block 615, the method 600 may include mapping the interleaved encoded bits to a plurality of resource elements in an OFDM symbol. Aspects of block 615 may be performed by modulation mapper 245 described with reference to FIG. 2.

At block 620, the method 600 may include transmitting the mapped resource elements to the receiving device. Aspects of block 620 may be performed by transmitter 250 described with reference to FIGS. 2 and 5.

In some aspects, determining the effective size of the interleaving block based on the first number of control resource elements and the second number of control elements may comprise determining a default size of the interleaving block based on hardware capabilities of an UE, and calculating the effective size of the interleaving block by subtracting one of the first number of control resource elements or the second number of control resource elements from the default size of the interleaving block.

In some examples, determining the effective size of the interleaving block may comprise identifying a greater of the first number of control resource elements or the second number of control resource elements, and calculating the effective size of the interleaving block by subtracting the greater of the first number of control resource elements or the second number of control resource elements from a default size of the interleaving block.

In another example, determining the effective size of the interleaving block may comprise identifying a smaller of the first number of control resource elements or the second number of control resource elements, and calculating the effective size of the interleaving block by subtracting the smaller of the first number of control resource elements or the second number of control resource elements from a default size of the interleaving block.

In yet further examples, determining the effective size of the interleaving block may comprise calculating a first effective size of the interleaving block based on the first number of control resource elements in a first region of a bandwidth and calculating a second effective size of the interleaving block based on the second number of control resource elements in a second region of the bandwidth. In such instance, the interleaving step (block 620) may include interleaving the first data in the first group of resource elements based on the first effective size of the interleaving block within the first region of the bandwidth, and interleaving the second data in the second group of resource elements independently of the first data based on the second effective size of the interleaving block within the second region of the bandwidth.

At block 620, the method may include interleaving a first data in the first group of resource elements and a second data in the second group of resource elements based on the effective size of the interleaving block. In some examples, the first data in the first group of resource elements may be interleaved independent of the second group of resource elements. Particularly, the first data from the first group of resource elements may be interleaved within a first region of bandwidth, while the second data from the second group of resource elements may be interleaved within a second region of the bandwidth. In other examples, both the first data from the first group of resource elements and the second data from the second group of resource elements may be interleaved across the entire bandwidth.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

It should be noted that the techniques described above may be used for various wireless communication networks such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A system for purposes of example, and LTE terminology is used in much of the description below, although the techniques are applicable beyond LTE/LTE-A applications (e.g., to 5G networks or other next generation communication systems).

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein but is to be accorded the widest scope consistent with the principles and novel features disclosed herein.

What is claimed is:

1. A method for transmitting information in wireless communications, comprising:
generating, at a transmitting device, encoded bits for a plurality of code blocks;
interleaving the encoded bits across the plurality of code blocks to generate interleaved encoded bits;
mapping the interleaved encoded bits to a plurality of resource elements in an orthogonal frequency-division multiplexing (OFDM) symbol; and
transmitting the mapped resource elements to a receiving device.

2. The method of claim 1, wherein interleaving the encoded bits across the plurality of code blocks to generate the interleaved encoded bits, comprises:
determining an effective size of an interleaving block based on a code block size of the plurality of code blocks after rate matching; and
interleaving the encoded bits across the plurality of code blocks to generate the interleaved encoded bits based on the effective size of the interleaving block.

3. The method of claim 2, wherein the effective size of the interleaving block is a number of bits that are collectively shifted from a portion of a first code block from the plurality of code blocks to a portion of a second code block from the plurality of code blocks.

4. The method of claim 2, wherein the effective size of the interleaving block is an integer value of a number of bits greater than or equal to one.

5. The method of claim 1, wherein interleaving the encoded bits across the plurality of code blocks, comprises:
interleaving the encoded bits across the plurality of code blocks to generate interleaved encoded bits independent of a code block size of the one or more code blocks.

6. The method of claim 1, wherein interleaving the encoded bits across the plurality of code blocks to generate the interleaved encoded bits, comprises:
determining an effective depth of an interleaving block for the OFDM symbol; and
interleaving the encoded bits across the plurality of code blocks to generate the interleaved encoded bits based on the effective depth of the interleaving block.

7. The method of claim 6, wherein the effective depth of the interleaving block is a number of bits in the interleaving stream of bits that separate the consecutive interleaving blocks of the initial stream of bits.

8. The method of claim 6, wherein the effective depth of the interleaving block is an integer value greater than or equal to one.

9. The method of claim 6, wherein the effective depth of the interleaving block is selected based on a pseudo-random seed, wherein the pseudo-random seed is determined based on:
a UE identification (ID),
a cell ID (ID),
a virtual cell ID,
a slot index,
a symbol index within a slot,
subcarrier spacing,
a subframe ID,
a frame ID,
a symbol index inside a subframe, or
some combination thereof.

10. The method of claim 1, further comprises:
determining whether to perform bit-level interleaving or tone-level interleaving for each subframe; and
wherein the interleaving of the encoded bits across the plurality of code blocks is in response to the determination to perform bit-level interleaving.

11. The method of claim 10, wherein determining whether to perform the bit-level interleaving or the tone-level interleaving is based on:
a number of bits that are carried in each tone,
a size of the plurality of code blocks,
a multiple input, multiple output (MIMO) transmission rank,
a modulation and coding scheme (MCS) index,
transmission scheme, a processing time requirements,
the transmitting device or a receiving device capabilities,
available power at the receiving device,
the transmitting device preference,
the receiving device preference, or
some combination thereof.

12. The method of claim 11, wherein interleaving the encoded bits across the plurality of code blocks to generate the interleaved encoded bits, comprises:
determining an effective size of an interleaving block, wherein the effective size of the interleaving block depends on a number of code blocks in each OFDM.

13. A transmitting device for transmitting information in wireless communications, comprising:
a memory configured to store instructions; and
a processor communicatively coupled with the memory, the processor configured to execute the instructions to:
generate, at the transmitting device, encoded bits for a plurality of code blocks;
interleave the encoded bits across the plurality of code blocks to generate interleaved encoded bits;
map the interleaved encoded bits to a plurality of resource elements in an orthogonal frequency-division multiplexing (OFDM) symbol; and
transmit the mapped resource elements to a receiving device.

14. The transmitting device of claim 13, wherein the processor configured to execute the instructions to interleave the encoded bits across the plurality of code blocks to generate the interleaved encoded bits, is further configured to execute the instructions to:
determine an effective size of an interleaving block based on a code block size of the plurality of code blocks after rate matching; and
interleave the encoded bits across the plurality of code blocks to generate the interleaved encoded bits based on the effective size of the interleaving block.

15. The transmitting device of claim 14, wherein the effective size of the interleaving block is a number of bits that are collectively shifted from a portion of a first code block from the plurality of code blocks to a portion of a second code block from the plurality of code blocks.

16. The transmitting device of claim 14, wherein the effective size of the interleaving block is an integer value greater than or equal to one.

17. The transmitting device of claim 13, wherein the processor configured to execute the instructions to interleave the encoded bits across the plurality of code blocks to generate the interleaved encoded bits, is further configured to execute the instructions to:
interleave the encoded bits across the plurality of code blocks to generate interleaved encoded bits independent of a code block size of the one or more code blocks.

18. The transmitting device of claim 13, wherein the processor configured to execute the instructions to interleave the encoded bits across the plurality of code blocks to generate the interleaved encoded bits, is further configured to execute the instructions to:
- determine an effective depth of an interleaving block for the OFDM symbol; and
- interleave the encoded bits across the plurality of code blocks to generate the interleaved encoded bits based on the effective depth of the interleaving block.

19. The transmitting device of claim 18, wherein the effective depth of the interleaving block is a number of bits in the interleaving stream of bits that separate the consecutive interleaving blocks of the initial stream of bits.

20. The transmitting device of claim 18, wherein the effective depth of the interleaving block is an integer value greater than or equal to one.

21. The transmitting device of claim 18, wherein the effective depth of the interleaving block is selected based on a pseudo-random seed, wherein the pseudo-random seed is determined based on:
- a UE identification (ID),
- a cell ID (ID),
- a virtual cell ID,
- a slot index,
- a symbol index within a slot,
- subcarrier spacing,
- a subframe ID,
- a frame ID,
- a symbol index inside a subframe, or
- some combination thereof.

22. The transmitting device of claim 13, wherein the processor is further configured to execute the instructions to:
- determine whether to perform bit-level interleaving or tone-level interleaving for each subframe; and
- wherein the encoded bits are interleaved across the plurality of code blocks in response to the determination to perform bit-level interleaving.

23. The transmitting device of claim 22, wherein the determination whether to perform the bit-level interleaving or the tone-level interleaving is based on:
- a number of bits that are carried in each tone,
- a size of the plurality of code blocks,
- a multiple input, multiple output (MIMO) transmission rank,
- a modulation and coding scheme (MCS) index,
- transmission scheme, a processing time requirements,
- the transmitting device or a receiving device capabilities,
- available power at the receiving device,
- the transmitting device preference,
- the receiving device preference, or
- some combination thereof.

24. A non-transitory computer readable medium for transmitting information in wireless communications, comprising code for:
- generating, at a transmitting device, encoded bits for a plurality of code blocks;
- interleaving the encoded bits across the plurality of code blocks to generate interleaved encoded bits;
- mapping the interleaved encoded bits to a plurality of resource elements in an orthogonal frequency-division multiplexing (OFDM) symbol; and
- transmitting the mapped resource elements to a receiving device.

25. The non-transitory computer readable medium of claim 24, wherein the code for interleaving the encoded bits across the plurality of code blocks to generate the interleaved encoded bits, further comprises code for:
- determining an effective size of an interleaving block based on a code block size of the plurality of code blocks after rate matching; and
- interleaving the encoded bits across the plurality of code blocks to generate the interleaved encoded bits based on the effective size of the interleaving block.

26. The non-transitory computer readable medium of claim 25, wherein the effective size of the interleaving block is a number of bits that are collectively shifted from a portion of a first code block from the plurality of code blocks to a portion of a second code block from the plurality of code blocks.

27. The non-transitory computer readable medium of claim 25, wherein the effective size of the interleaving block is an integer value greater than or equal to one.

28. The non-transitory computer readable medium of claim 24, wherein the code for interleaving the encoded bits across the plurality of code blocks further comprises code for:
- interleaving the encoded bits across the plurality of code blocks to generate interleaved encoded bits independent of a code block size of the one or more code blocks.

29. The non-transitory computer readable medium of claim 24, wherein the code for interleaving the encoded bits across the plurality of code blocks to generate the interleaved encoded bits further comprises code for:
- determining an effective depth of an interleaving block for the OFDM symbol; and
- interleaving the encoded bits across the plurality of code blocks to generate the interleaved encoded bits based on the effective depth of the interleaving block.

30. An apparatus for transmitting information in wireless communications, comprising:
- means for generating, at a transmitting device, encoded bits for a plurality of code blocks;
- means for interleaving the encoded bits across the plurality of code blocks to generate interleaved encoded bits;
- means for mapping the interleaved encoded bits to a plurality of resource elements in an orthogonal frequency-division multiplexing (OFDM) symbol; and
- means for transmitting the mapped resource elements to a receiving device.

\* \* \* \* \*